(12) United States Patent
Fu

(10) Patent No.: US 6,368,911 B2
(45) Date of Patent: *Apr. 9, 2002

(54) METHOD FOR MANUFACTURING A BURIED GATE

(75) Inventor: Kuan-Yu Fu, Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,311

(22) Filed: Oct. 27, 1998

(30) Foreign Application Priority Data

May 26, 1998 (TW) .......................................... 87108193

(51) Int. Cl.⁷ ..................... H01L 21/8242; H01L 21/28; H01L 21/336
(52) U.S. Cl. ....................... 438/248; 438/589; 438/259; 257/314
(58) Field of Search ................................ 438/248, 589, 438/259, 270, 272, 585, 587, 588, 427, 430; 257/319, 320, 321, 322, 233, 324, 325, 326

(56) References Cited

U.S. PATENT DOCUMENTS

| | | | | |
|---|---|---|---|---|
| 4,905,062 A | * | 2/1990 | Esquivel et al. ............. | 257/316 |
| 5,366,914 A | * | 11/1994 | Takahashi et al. ........... | 438/270 |
| 5,693,547 A | * | 12/1997 | Gardner et al. .............. | 438/270 |
| 5,744,847 A | * | 4/1998 | Wen ........................... | 257/397 |
| 5,866,457 A | * | 10/1999 | Wen ........................... | 438/275 |
| 5,998,288 A | * | 12/1999 | Gardner et al. .............. | 438/589 |
| 6,060,739 A | * | 5/2000 | Saithoh ....................... | 257/314 |

* cited by examiner

Primary Examiner—Charles Bowers
Assistant Examiner—Brook Kebede

(57) ABSTRACT

A method of manufacturing buried gates by performing two trench-forming operations. The method includes forming a first trench in a substrate, and then forming a dielectric layer over the substrate and the interior surface of the first trench. Next, conductive material is deposited into the first trench. Thereafter, second trenches are formed crossing the first trench alternately, wherein the second trenches has a depth greater than the depth of the first trench. Subsequently, insulation material is deposited into the second trenches simultaneously forming buried gates and isolation structures. Floating and control gates are then formed over the buried gates. A similar method can be used to form buried conductive layer by omitting the formation of the dielectric layer.

20 Claims, 5 Drawing Sheets

METHOD FOR MANUFACTURING A BURIED GATE

CROSS-REFERENCE TO RELATED APPLICATION

This application claims the priority benefit of Taiwan application serial no. 87108193, filed May 26, 1998, the full disclosure of which is incorporated herein by reference.

BACKGROUND OF THE INVENTION

1. Field of Invention

The present invention relates to a method of manufacturing a buried gate. More particularly, the present invention relates to methods of manufacturing the buried gate of an electrically erasable programmable read only flash memory.

2. Background

Read only memory (ROM) is a type of non-volatile memory capable of retaining information even when the power is off. After the appearance of ROM, other types of ROMs, for example, the erasable programmable ROM (EPROM), whose memory content can be erased and re-programmed were developed. However, because the erasure of data within an EPROM requires the irradiation of ultra-violet light, its packaging cost is high. Furthermore, since all of the data or programs stored in an EPROM will be erased in a single operation, a time-consuming complete re-programming operation has to be carried out whenever any modification is required.

At present, a type of ROM known as an electrically erasable programmable ROM (EEPROM) are commonly used. The EEPROM is capable of modifying of data locally, and that data erasure and re-programming can be carried out in a bit-by-bit fashion. Moreover, the EEPROM can be read, erased and re-programmed iteratively. Recently, EEPROMs having an access speed of between 70 ns to 80 ns were developed by Intel Corporation with the name "flash memory". A flash memory has a structure somewhat like an EEPROM. However, the flash memory performs memory erasure in a block-by-block manner, and hence the speed of operation is faster. Often, memory erasure by the flash memory can be completed within 1 to 2 seconds, thereby saving time and manufacturing cost.

In general, the gate of a flash memory cell includes a two-layered structure. One of the layers, usually a polysilicon layer, serves as a floating gate used for storing electric charges. The other layer is a control gate serving to control the access of information. The floating gate is located beneath the control gate. Normally, the floating gate is in a "floating" state having no connection with other circuits. The control gate is generally connected to a word line. When data needs to be stored in a flash memory, a voltage is applied to the drain region and then a voltage higher than the applied drain voltage is applied to the control gate. Hot electrons will thus flow out from the source region and tunnel through the oxide layer near the drain region. The electrons are injected into the floating gate region and are trapped. Hence, the threshold voltage of the transistor is raised and the desired data is stored. When data are to be erased from a flash memory, a suitable positive voltage can be applied to the source region. The electrons trapped by the floating gate are tunneled out through the oxide layer. Hence, the stored data are erased, and that the floating gate of the transistor is returned to the previous storage state.

FIG. 1 is a cross-sectional view showing the transistor memory structure of a conventional flash ROM. As shown in FIG. 1, the memory unit mainly comprises a floating gate transistor. The gate of the transistor includes a two-layered structure. One of the layers is a floating gate 10, usually a polysilicon layer, serving as a region for storing electric charges. Another layer is a control gate 12 serving to control the access of information. In addition, there are tunneling oxide layer 14, gate oxide layer 16, drain region 18, source region 20. The floating gate 10 is located beneath the control gate 12. Normally, the floating gate is in a "floating" state having no connection with other circuits, whereas the control gate is generally connected to a word line.

The aforementioned flash ROM operates through the action of hot electrons. When data needs to be stored in the flash memory, a negative voltage is applied to the drain region 18 of the semiconductor substrate 22. Then, a voltage higher even than the voltage applied to the drain region 18 is applied to the control gate 12. Consequently, hot electrons will flow out from the source region 20 and tunnel through the oxide layer 14 near the drain region 18. Finally, the electrons tunnel through the tunneling gate 10 then into the floating gate region 10 where they are then trapped. Hence, the threshold voltage of the transistor is raised and the desired data is stored. On the other hand, when data need to be erased from a flash memory, a suitable positive voltage can be applied to the source region 20. Consequently, the trapped electrons within the floating gate 10 are tunneled out through the oxide layer 14 and into the semiconductor substrate 22. Hence, the stored data is erased, and the floating gate 10 of the transistor is returned to the previous storage state.

To reduce programming time and erase time for a flash ROM, the electric field in the tunneling region has to be increased. Conventionally, the method of increasing the electric field in the tunneling region is to increase the overlapping area between the floating gate and the control gate. In other words, the electric field is increased by increasing the coupling ratio of the flash ROM. In general, the method of increasing the coupling ratio is to utilize the space above the isolation region (including field oxide layer or shallow trench isolation region) for increasing the overlapping area between the floating gate and the control gate. However, since the current trend is moving towards high-level integration of semiconductor devices and memory devices, increasing overlapping area for increasing coupling ratio is contradictory to current development.

Alternatively, the electric field within the tunneling region 14 can be increased by increasing the operating voltage. But this alternative method of increasing the operating voltage for programming and erasing of flash ROM goes against current trends as well. This is because tremendous efforts has been put trying to lower heat output and noise interference for greater efficiency, and hence operating voltages are kept as low as possible. Moreover, increasing the operating voltage not only will lead to band-to-band tunneling between the floating gate and the drain, but also will waste power and leading to reliability problems. Furthermore, extra high-voltage pump circuits has to be added to amplify the input voltage if the operating voltage has to increase. This will increase area occupation of silicon chip and will lead to an increased circuit time delay.

In light of the foregoing, there is a need to provide an improved and more efficient method of forming buried floating gate flash ROM.

SUMMARY OF THE INVENTION

In view of the above, one method of dealing with the problems is to form a memory structure that has a buried floating gate. In other words, the floating gate of the flash memory is buried inside the substrate with the source/drain regions positioned on opposing sides of the floating gate. The control gate is placed over the floating gate above the substrate surface. With this type of memory cell structure the charges tunnel from the control gate through the dielectric layer into the floating gate instead of tunnel through the thin dielectric layer and substrate then into the floating gate. Therefore the tunneling leakage current can be avoided and the tunneling speed between the floating gate and the control gate can be faster.

That is, the invention reduces the overlapping area between the control gate and floating gate while increasing the overlapping area between the floating gate and substrate. Therefore, the flash ROM will be scalable without relying on high charge pumping circuits. This is opposite to the conventional cells. Further, the floating gate is formed by a buried type of gate, hence programming speed of the flash ROM is increased while more memory cells can be packed within the same surface area of the chip.

Accordingly, the present invention is to provide a method of manufacturing flash ROM having buried floating gates. The method makes use of two trench-forming operations to form simultaneously buried floating gates and isolation structures. Through the method, the manufacturing of floating gate structures is greatly simplified. Moreover, the same method can be used to manufacture other buried conductive layers so that a multiple of buried conductive layers, each separated by isolation structures, can be formed at the same time.

To achieve these and other advantages and in accordance with the purpose of the invention, as embodied and broadly described herein, the invention provides a method of forming a buried gate that can be applied to the manufacturing of the floating gate of a flash ROM. The method includes the steps of providing a substrate, and then forming a first trench in the substrate. Preferably, a first dielectric layer is formed over the substrate and the interior surface of the first trench, and then a first conductive layer is formed filling the first trench. Thereafter, a plurality of second trenches is formed within the first conductive layer and in the substrate. Finally, an insulation layer is deposited, filling the second trenches so that the first conductive layer is transformed into a plurality of floating gates.

Both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
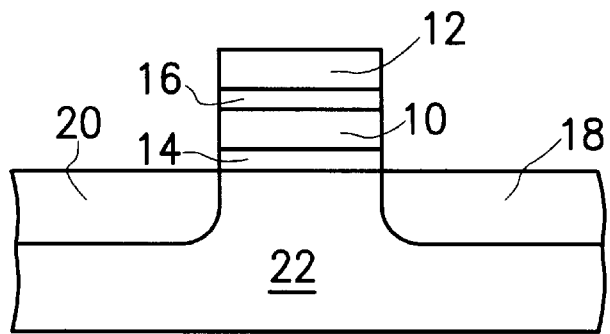
FIG. 1 is a cross-sectional view showing the transistor memory structure of a conventional flash ROM.

Reference will now he made in detail to the present preferred embodiments of the invention, examples of which are illustrated in the accompanying drawings. Wherever possible, the same reference numbers are used in the drawings and the description to refer to the same or like parts.

Figure 2:
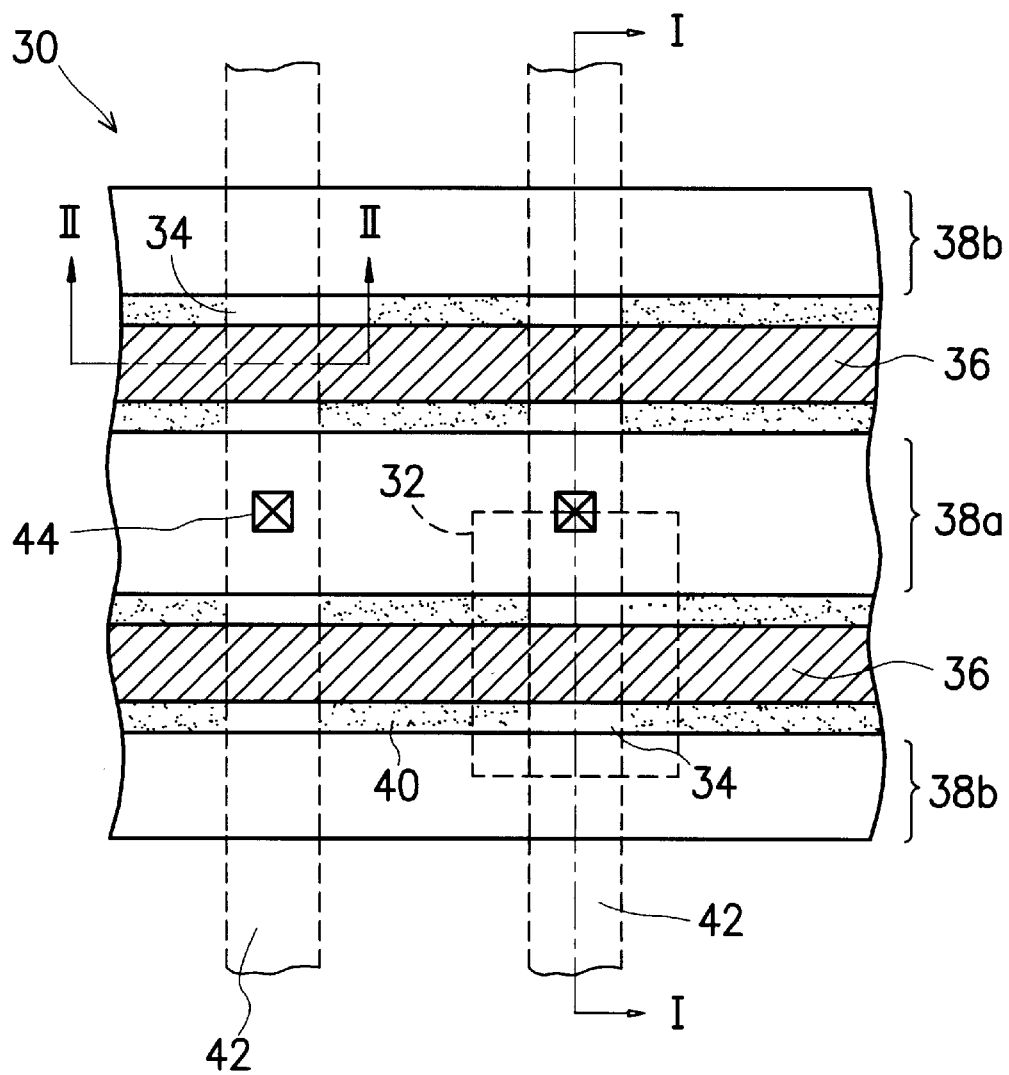
FIG. 2 is a top view showing the layout of electrically erasable programmable flash ROM structure according to one preferred embodiment of this invention.

FIG. 2 is a top view showing the layout of electrically erasable programmable flash ROM structure according to one preferred method of this invention. As shown in FIG. 2, an electrically erasable programmable flash ROM (flash EEPROM) 30 is composed of a plurality of flash ROM cells 32. Each memory cell 32 has at least a floating gate 34, a control gate 36 (word line) aligned with the floating gate 34, and source/drain regions 38a and 38b on opposing sides of the floating gate 34. According to the circuit connections illustrated in this embodiment, source/drain region 38a serves as the drain of the memory cell, and the source/drain region 38b serves as the source of the memory cell 32. In addition, the flash ROM 30 further includes some isolation structures 40 between each adjacent memory cell 32, and bit lines 42 that link up the drains 38a of each memory cell 32. The bit lines 42 are connected to the drains 38a through contact windows 44.

Figure 3:
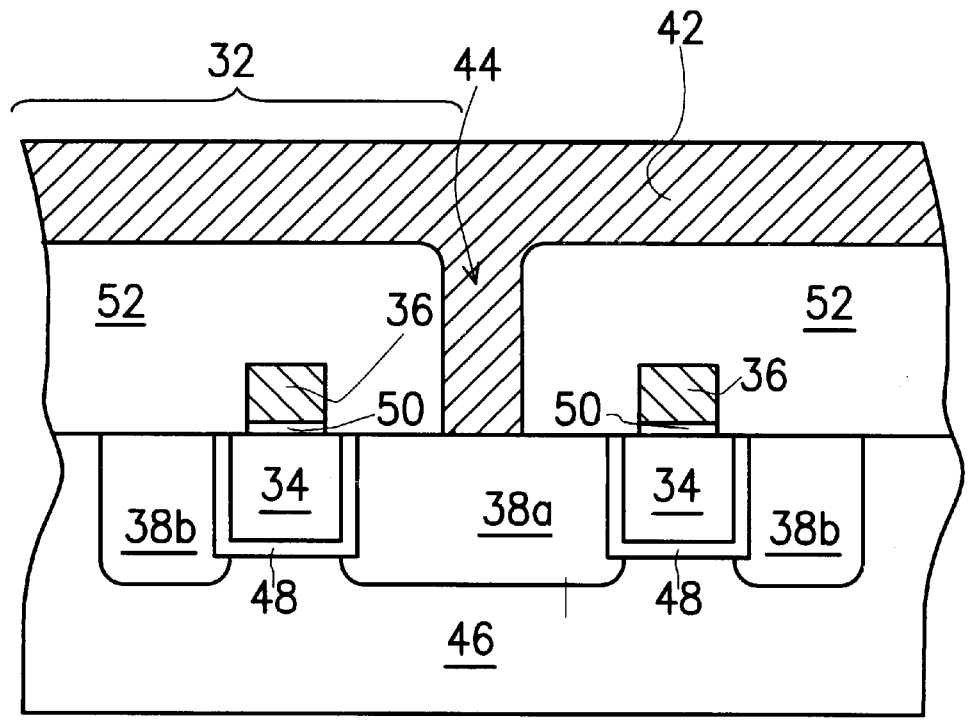
FIG. 3 is a cross-sectional view along line 3—3 of FIG. 2.
Figure 4:
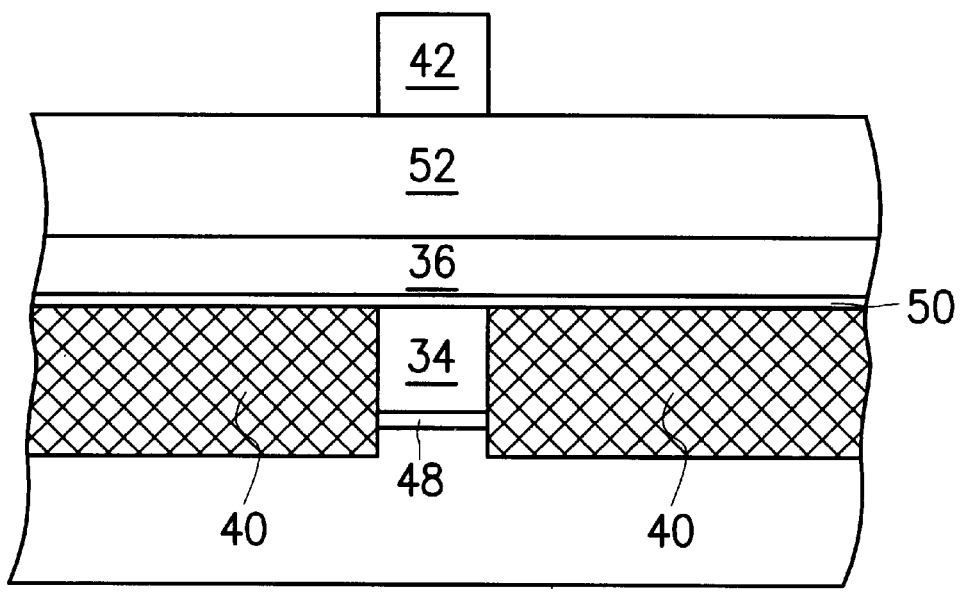
FIG. 4 is a cross-sectional view along line 4—4 of FIG. 2.

FIG. 3 is a cross-sectional view along line 3—3 of FIG. 2, and FIG. 4 is a cross-sectional view along line 4—4 of FIG. 2. In FIGS. 3 and 4, the flash EEPROM is build on top of a substrate 46. This substrate 46 can be for example, a P-type substrate, and the floating gate 34 of the memory cell 32 can be preferably buried within the substrate 46. The floating gate 34 can be, for example, a doped polysilicon layer, surrounded by a first dielectric layer 48 that encloses its sidewalls and bottom. The dielectric layer 48 can be a silicon dioxide layer, for example. The source terminal 38b and drain terminal 38a of the memory cell 32 are positioned on each side of the floating gate 34. The source and drain terminals 38b and 38a are preferably formed by selective implant of N-type ions into the substrate 46, but could also be, for example, As ions. Both the source region 38b and the drain region 38a are adjacent to the floating gate 34, and they are isolated from the floating gate 34 by the first dielectric layer 48. The control gate 36 is formed over the floating gate 34 and above the substrate 46 surface. The control gate can be a doped polysilicon layer, for example. Furthermore, the control gate 36 is isolated from the floating gate 34 by a second dielectric layer 50. The second dielectric layer 50 can be a silicon dioxide layer. In addition, an insulation layer 52 is formed over the memory cell 32. The insulation layer 52 is preferably a silicon dioxide layer. Furthermore, the insulation layer 52 has a contact window 44 for connecting, electrically between the bit line 42 and the drain terminal 38a of the memory cell 32. The bit line 42 can be a doped polysilicon layer, for example. Finally, isolation structures 40 are formed between the memory cells 32, and these isolation structures include shallow trench isolation.

There is thus provided a floating gate 34 isolated by dielectric layer 48 on a first surface of floating gate 34. A drain region 38a abuts the dielectric layer 48 on a different, preferably opposing surface of floating gate 34. A control gate 36 abuts the insulating layer shown as second dielectric layer 50, on a third surface of floating gate 34. Advantageously the third surface is orthogonal to and interposed between the first and second surfaces which are advantageously parallel.

Conventional flash ROM requires a higher operating voltage in the program mode for detecting the hot carriers between the source and the drain terminal allowing a portion of the high-energy hot carriers to tunnel from the drain terminal to the floating gate. Consequently, a higher proportion of hot electrons will become leakage current resulting in power wastage.

In the present inventions, the floating gate 34 of the flash memory is advantageously buried inside a larger semiconductor structure and preferably buried inside, the substrate 46 with the source/drain regions 38b and 38a positioned on opposing sides of the floating gate 34. The control gate 36 is placed over the floating gate 34 above the substrate 46 surface. With this type of memory cell structure, the charges tunnel through the dielectric layer 50 between the control gate 36 and the floating, gate 34, and into the floating gate 34 instead of tunnel through the thin dielectric layer 14 between the floating gate 10 and substrate 22 (FIG. 1). Therefore the tunneling leakage current can be avoided and the tunneling speed between the floating gate 34 and the control gate 36 can be faster.

Therefore, the buried floating gate structure of this invention enables the tunneling of electrons between the floating gate and the control gate during program mode with the lower operating voltage. Moreover, there is no need to generate hot carriers between the source terminal and the drain terminal, thereby reducing current leakage problem. Furthermore, with a lower operating voltage, tunneling can occur more readily and hence increase programming speed. In addition, the flash ROM structure of this invention does not require an increase in floating gate and control gate dimensions for triggering the tunneling effect, and hence the level of integration can be increased.

Figure 5A:
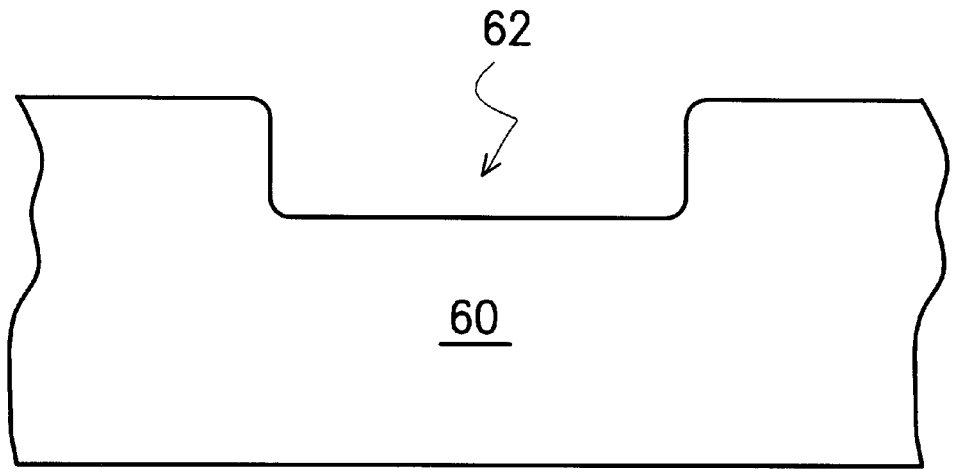
FIGS. 5A through 5F are cross-sectional views showing the progression of manufacturing steps in fabricating a buried floating gate flash ROM according to one preferred embodiment of this invention.

FIGS. 5A through 5F are cross-sectional views showing the progression of manufacturing processes used in fabricating a buried floating gate flash ROM according to one preferred embodiment of this invention. Note that the cross-sections from FIGS. 5A to 5F are cut along the same direction as line 4—4 FIG. 2. To fabricate a buried floating gate structure of flash ROM (as shown in FIGS. 3 and 4), a first trench 62 is formed in a substrate 60 as shown in FIG. 5A. The substrate 60 can be a P-type substrate or a P-well, and lattice direction of crystal can be <001>. The method of forming the first trench 62 includes an anisotropic dry etching method, for example. Other method of forming trenches are also suitable.

Figure 5B:
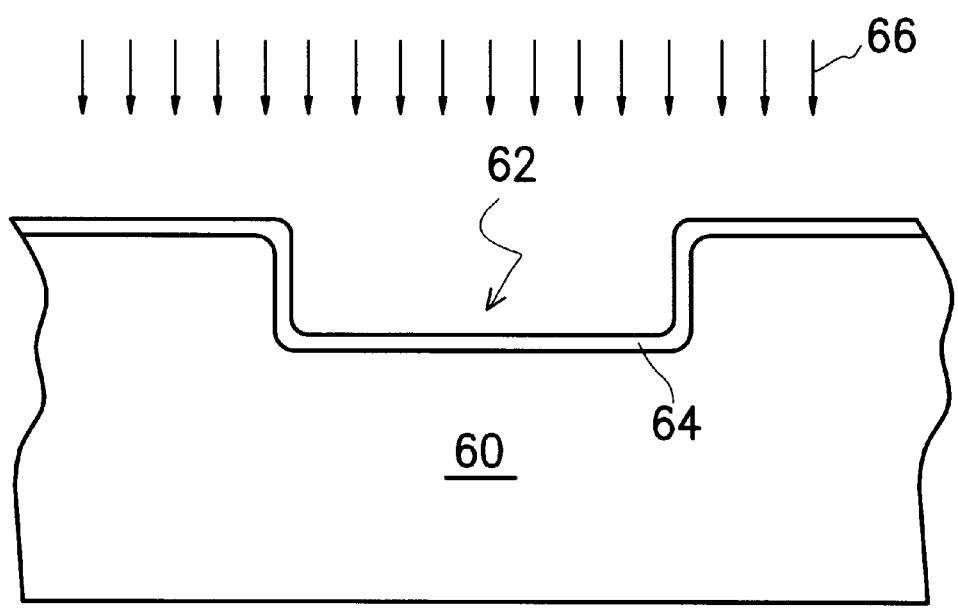

As shown in FIG. 5B, a first dielectric layer 64 is formed over the interior surface of the first trench 62 and the substrate 60 serves as a gate oxide layer (labeled 48 in FIG. 3). The first dielectric layer 64 can be a silicon dioxide layer formed using, for example, a thermal oxidation method. Other dielectric materials and forming methods can be used. Thereafter, an ion implant is carried out (label 66 in FIG. 5B) implanting N-type ions into regions below the first dielectric layer 64. The ion implant serves to adjust the threshold voltage of transistor channel.

Figure 5C:
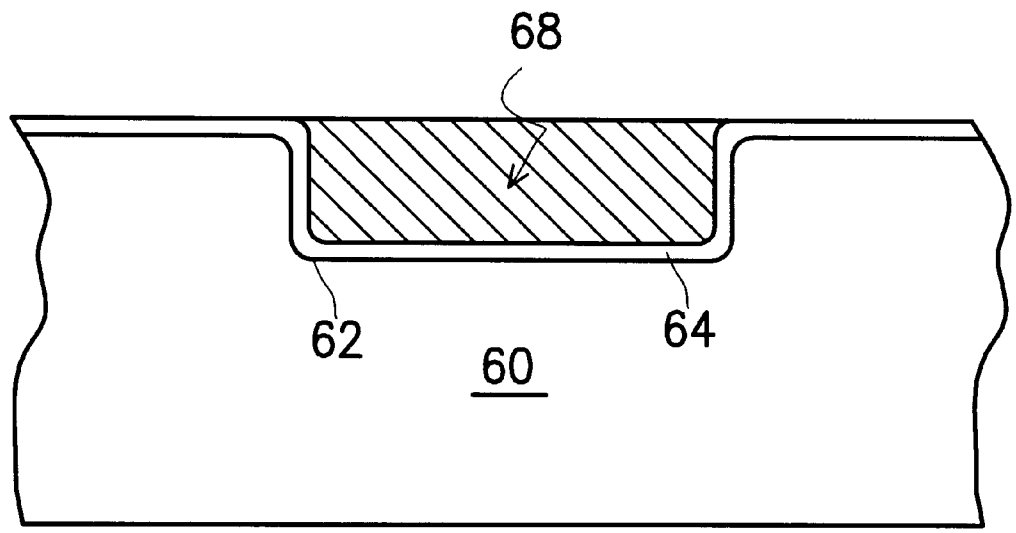

As shown in FIG. 5C, a first conductive layer 68 is formed filling the first trench 62. The first conductive layer 68 can be a doped polysilicon layer formed by first depositing polysilicon over the substrate and filling the first trench 62, and then etching back or chemical-mechanical polishing the polysilicon material to remove a portion of the polysilicon material above the substrate 60 surface so that the first dielectric layer 64 is exposed.

Figure 5D:
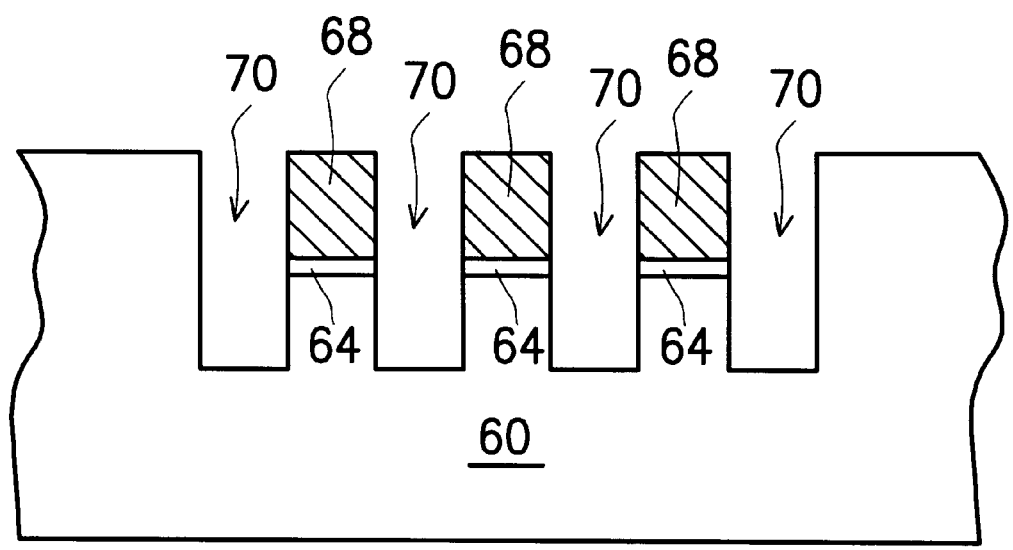

As shown in FIG. 5D, the first dielectric layer above the substrate 60 is removed, and then a plurality of second trenches 70 are formed in the substrate 60 and the first conductive layer 68. The first dielectric layer 64 can be removed using, for example, hydrofluoric acid (HF), while the second trenches can be etched out using, for example, an anisotropic dry etching method. Note that the long axis of the first trench 62 is parallel to the cross-sectional direction, whereas the long axis of the second trenches 70 are perpendicular to the cross-sectional direction. By forming the second trenches 70, the first conductive layer 68 is cut into a number of sections, thereby forming a plurality of buried floating gates 68 so that the second trenches 70 extend through the first dielectric layer 64 and into the surrounding material, which is shown here as substrate 60. Advantageously the trenches 62 are parallel to one another, and the trenches 70 are parallel to each other, but the trenches 62 and 70 are perpendicular to each other to form generally square or rectangular floating gates 68, and memory cells 32, although other angles of intersection can be used to produce devices of different shape.

Figure 5E:
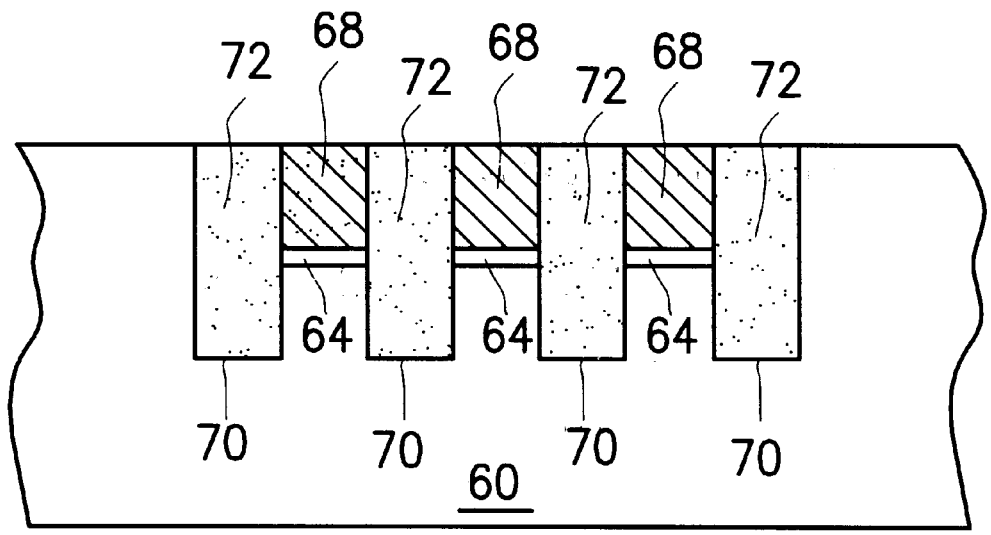

As shown in FIG. 5E, insulation material is deposited into the second trenches 70 to form insulation layers 72 that serve as shallow trench isolation structure 40 between neighboring memory cells 32 (FIG. 2). The insulation layer 72 is preferably a silicon dioxide layer formed by first depositing silicon dioxide over the substrate 60 surface and filling the second trenches 70, and then etching back or chemical-mechanical polishing the silicon dioxide layer to remove a portion of the silicon dioxide material above the substrate 60 so that the first conductive layer 68 and the substrate 60 surface are exposed. At this stage, the buried floating gates and the shallow trench isolation structures are formed. Advantageously the exterior surface of floating gates 68 are in the same plane as the surface of the substrate 60 on opposing sides of the floating gates 68. The floating gate 68 (FIG. 5E) correspond to floating gates 34 (FIG. 3). The floating gates 34, 68 are surrounded on the bottom and ends by dielectric layer 48 or 64, and are bounded on the sides by the insulation layer 72.

Figure 5F:
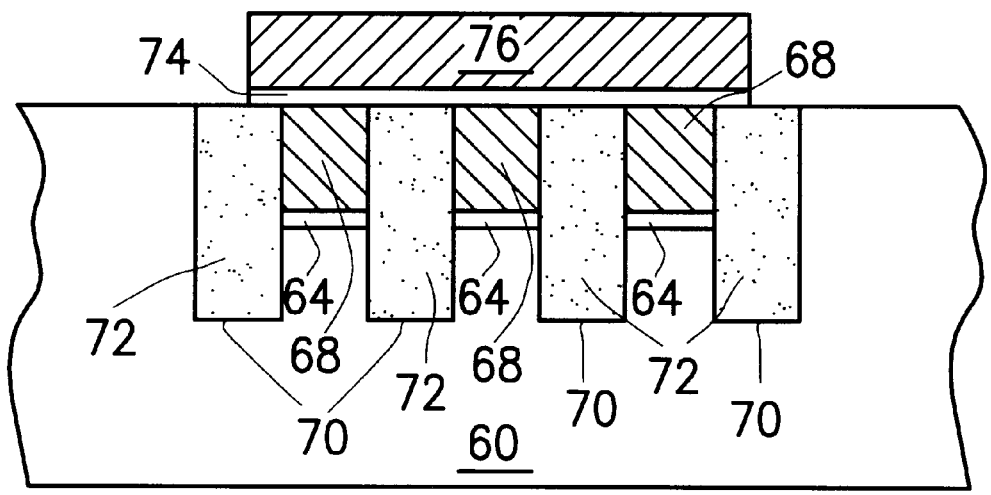

Subsequently, as shown in FIG. 5F, a second dielectric layer 74 and a second conductive layer 76 are sequentially formed over the substrate 60, and then the second dielectric layer 74 and the second conductive layer 76 are patterned to form a control gate 36 (FIG. 3). The second dielectric layer 74 serves as a gate oxide layer between the floating gate 34 and the control gate 36. The second dielectric layer 74 can be a silicon dioxide layer formed using, for example, a chemical vapor deposition method. The second conductive layer 76 can be a doped polysilicon layer also formed using a chemical vapor deposition method. Patterning of the second dielectric layer 74 and the second conductive layer 76 can be achieved through a photolithographic and etching operation. Other method can also be used to form control gate 36 and dielectric layer 74.

Thereafter, subsequent operations that include doping to form the source/drain regions 38b and 38a respectively and forming the bit lines 56 to interconnect memory cells 32 to form various types of memory storage devices, can be carried out using conventional methods, and so detail description is omitted here. Source region 38b and drain region 38a are formed in the substrate on opposite sides of the buried gates so that a voltage applied to the source region 38b or drain region 38a will cause electrons to tunnel through the first dielectric layer 64 or 48 and into the floating gate 34 (FIG. 3). In the above embodiment of this invention, although the process of manufacturing buried floating gates is illustrated, it should not be construed as the only means of application, and should not restrict the use of this invention as such.

This invention can be similarly applied to the fabrication of buried conductive layer. In this case, it is necessary only to cancel that part of the operations where the first dielectric layer 68 and the second dielectric layer 74 are formed. Therefore, the complete fabrication procedures are not repeated here. Briefly described, this method includes the steps of forming a first trench in the substrate. A conductive layer is formed and fills the first trench. Second trenches are then formed in the conductive layer and the substrate within the first trench. An insulation layer is then formed and fills the second trenches.

In summary, this invention uses two trench-forming operations to form buried floating gates and isolation structures at the same time. Therefore, using the method of this invention, the process of forming buried floating gate structures is very much simplified. In addition, other buried conductive layer can also be fabricated. Moreover, a multiple of buried conductive layers and its associated isolating structures can be formed together using the operations. Furthermore, the buried floating gate flash ROM created by this invention has a lower leakage current, a higher programming speed, and a higher level of integration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a semiconductor containing buried gates having a drain region and a source region on opposite sides of the buried gates, comprising the steps of:

providing a substrate;

forming a first trench in the substrate, the first trench being adjacent to the location where the drain region and the source region will be formed, the trench having a bottom and opposing sides;

forming a first dielectric layer over an interior surface of the first trench;

forming a first conductive layer that fills the first trench;

forming a plurality of second trenches extending through the first conductive layer to separate the first conductive layer into a plurality of buried floating gates below a surface level of the substrate, the second trenches extending between the opposing sides of the first trench and to the first dielectric layer on at least the bottom of the first trench; and forming an insulation layer in at least the second trenches to further insulate the buried floating gates from each other.

2. The method of claim 1, wherein after the step of forming the insulation layer, further includes the substeps of:

forming a second dielectric layer over the substrate;

forming a second conductive layer over the second dielectric layer;

patterning the second conductive layer and the second dielectric layer to form a plurality of control gates aligned with the floating gates; and forming the source region and the drain region in the substrate on the opposite sides of the buried gates so that a voltage applied to the source region or drain region will cause electrons to tunnel through the first dielectric layer and into the floating gates.

3. The method of claim 1, wherein the second trench has a depth deeper than a depth of the first trench so as to extend through at least the bottom of the first trench and into the substrate.

4. The method of claim 1, wherein the step of forming the first trench includes an anisotropic dry etching method.

5. The method of claim 1, wherein the step of forming the first conductive layer to fill the first trench includes the substeps of:

depositing a first conductive layer over the substrate and into the first trench;

etching back to remove a portion of the first conductive layer and exposing the first dielectric layer so that the conductive layer fills the first trench; and removing the exposed first dielectric layer.

6. The method of claim 1, wherein the step of forming the first conductive layer to fill the first trench includes the substeps of:

depositing a first conductive layer over the substrate and into the first trench;

polishing chemical-mechanically to remove a portion of the first conductive layer and exposing the first dielectric layer so that the conductive layer fills the first trench; and removing the exposed first dielectric layer.

7. The method of claim 1, wherein the step of forming the first conductive layer includes depositing polysilicon.

8. The method of claim 1, wherein the step of forming the second trenches includes an anisotropic dry etching method.

9. The method of claim 1, wherein the step of forming the insulation layer to fill the second trenches includes the substeps of:

depositing insulation material over the substrate and into the second trenches; and etching back to remove a portion of the insulation layer and exposing the substrate and the first conductive layer so that the insulation layer fills the second trenches.

10. The method of claim 1, wherein the step of forming the insulation layer to fill the second trenches includes the substeps of:

depositing insulation material over the substrate and into the second trenches; and polishing chemical-mechanically to remove a portion of the insulation layer and exposing the substrate and the first conductive layer so that the insulation layer fills the second trenches.

11. The method of claim 1, wherein the step of forming the insulation layer includes depositing silicon dioxide.

12. The method of claim, 1 wherein the step of forming the first dielectric layer includes depositing silicon dioxide.

13. The method of claim 2, wherein the step of forming the second dielectric layer includes depositing silicon dioxide.

14. The method of claim 2, wherein the step of forming the second conductive layer includes depositing polysilicon.

15. The method of claim 1, wherein after the step of forming the first dielectric layer further includes implanting ions into the substrate to adjust the threshold voltage of channel underneath the first dielectric layer.

16. A method of manufacturing a buried conductive layer in a substrate, comprising the steps of:

forming a plurality of generally parallel first trenches in a material, the trenches having a bottom and opposing sides;

forming a first dielectric layer in the first trenches;

forming a conductive layer in the first trenches so that the first dielectric layer is interposed between the conductive layer and the material;

forming plurality of second trenches in the material extending between the opposing sides of the first trenches to form a plurality of devices with the conductive layer acting as a buried gate below a surface level of the substrate, wherein a long axis of the second trenches is perpendicular to the long axis of the first trenches;

forming an insulation layer in at least some of the second trenches to isolate the buried gates from each other.

17. The method of claim 16, wherein the devices comprise floating gates, and comprising the further steps of forming a second dielectric layer over the floating gates and forming a second conductive layer over the floating gates and patterning the second conductive layer to form a plurality of control gates aligned with the floating gates.

18. The method of claim 17, wherein the material comprises a substrate and the second trenches extend into the substrate.

19. The method of claim 17, comprising the further step of forming a source region and a drain region on opposing sides of the floating gates so that a voltage applied to one of the source and drain regions will cause electrons to tunnel through the first dielectric layer and into the floating gate.

20. A method of manufacturing a semiconductor containing buried gates having a drain region and a source region on opposite sides of the buried gates, comprising the steps of:

providing a substrate;

forming a first trench with a first long axis and a first depth in the substrate, the first trench being adjacent to the location where the drain region and the source region will be formed, the trench having a bottom and opposing sides;

forming a first dielectric layer over an interior surface of the first trench;

forming a first conductive layer that fills the first trench;

removing a portion of the first conductive layer, first dielectric layer and substrate to form a plurality of second trenches with a second depth in the first trench, wherein each second trench possesses a second long axis perpendicular to the first axis, the first conductive layer is divided into a plurality of buried floating gates below a surface level of the substrate, and the second depth is larger than the first depth; and forming an insulation layer in at least the second trenches to further insulate the buried floating gates from each other.

* * * * *